United States Patent [19]

Colles

[11] Patent Number: 4,847,621

[45] Date of Patent: Jul. 11, 1989

[54] APPARATUS FOR CONVERTING DATA BETWEEN DIGITAL AND ANALOG VALUES

[75] Inventor: Joseph H. Colles, Oceanside, Calif.

[73] Assignee: Brooktree Corporation, San Diego, Calif.

[21] Appl. No.: 26,539

[22] Filed: Mar. 13, 1987

Related U.S. Application Data

[63] Continuation of Ser. No. 607,178, May 4, 1984.

[51] Int. Cl.⁴ ............................................. H03M 1/76
[52] U.S. Cl. .................................... 341/148; 341/145
[58] Field of Search ............... 341/136, 145, 148, 154

[56] References Cited

U.S. PATENT DOCUMENTS 4,176,287 11/1979 Remedi ..................... 340/347 DD

FOREIGN PATENT DOCUMENTS

2069265 8/1981 United Kingdom .

*Primary Examiner*—William M. Shoop, Jr.
*Assistant Examiner*—Marc S. Hoff
*Attorney, Agent, or Firm*—Ellsworth R. Roston; Charles H. Schwartz

[57] ABSTRACT

A converter converts to an analog value a plurality of digital signals each having characteristics representing an individual digital value. A plurality of switches are disposed in sets with the switches in each set being responsive to an individual one of the digital signals. The number of switches in each set is related to the digital significance of the set, preferably on an inverse basis. The switches are connected in a repetitive array to output members and a line to provide for the connection for progressive ones of the members to the output line in accordance with the pattern of the switches in the conductive and non-conductive states in representation of progressive increases in the digital value. The repetitive also provides, with such progressive increases in the digital values, output members previously connected to the line. The repetitive array may be responsive to the digital signals in a single delay time. The output members progressively connected to the line preferably have a linear disposition. A current flows through each of such output members to indicate the analog value on a cumulative basis. In the converter, each of the ouput members may be connected to an individual one of the switches in the sub-set of least digital significance, alternate ones of the remaining output members may be connected to the control switches in the sub-set of next remaining digital significance; and the other output members may be connected to the switches in the sub-sets of progressive digital significance in a corresponding pattern.

29 Claims, 3 Drawing Sheets

FIG. 1

| Q2 | Q1 | Q0 | 0 | 1 | 2 | 3 | 4 | 5 | 6 | 7 | ANALOG VALVE |
|----|----|----|---|---|---|---|---|---|---|---|------|
| 0 | 0 | 0 | L | H | H | H | H | H | H | H | 0 |
| 0 | 0 | 1 | L | L | H | H | H | H | H | H | 1 |
| 0 | 1 | 0 | L | L | L | H | H | H | H | H | 2 |
| 0 | 1 | 1 | L | L | L | L | H | H | H | H | 3 |
| 1 | 0 | 0 | L | L | L | L | L | H | H | H | 4 |
| 1 | 0 | 1 | L | L | L | L | L | L | H | H | 5 |
| 1 | 1 | 0 | L | L | L | L | L | L | L | H | 6 |
| 1 | 1 | 1 | L | L | L | L | L | L | L | L | 7 |

APPARATUS FOR CONVERTING DATA BETWEEN DIGITAL AND ANALOG VALUES

This is a continuation of application Ser. No. 607,178 filed May 4, 1984.

This invention relates to apparatus for converting data between a digital form and an analog form. More particularly, the invention relates to apparatus which provides such convertion instantaneously and on a monotonic basis and in a simple and reliable manner.

Various types of equipment receive information in analog form. Such equipment includes process control equipment, measuring instruments, communication equipment and a wide variety of other equipment. Digital computers and data processing systems often receive input parameters in analog form from such equipment and convert these parameters to digital form for processing in the computer or the data processing equipment. After the analog information has been converted to digital information and has been processed, the output information from the digital computer or the data processing equipment is often converted to analog form. By converting the digital information to analog form, the user can assimilate the information in ways which would be difficult if the information remained in digital form.

A good example of the conversions discussed in the previous paragraph is in the recording and reproduction of music. The music is produced in analog form. It is converted to digital form by recently developed data processing techniques and is recorded on a medium such as a tape or a disc. When the music is to be reproduced, it is converted again to analog form because this is the form which is necessary to operate sound transducers to give meaning to the listener when he hears the music.

A digital computers and data processing equipment have become widespread throughout industry and the office and have even become common in the home, the need for inexpensive, simple and reliable apparatus for converting information between analog and digital forms has become of increasing concern. A considerable effort has been devoted over a period of several decades to provide converting apparatus which is simple, inexpensive and reliable. In spite of such efforts, the converting apparatus now in use does not meet such criteria.

The converting apparatus now in use also has other problems of long standing. For example, the converting apparatus now in use may not be monotonic unless it is quite expensive and complex. By "monotonic" is meant that digital information of progressively increasing valve is converted to analog information of progressively increasing value without any decrease in the analog value as the digital value progressively increases. The converting apparatus now in use also has relatively high differential and integral nonlinearities unless the apparatus is quite expensive and complex. Integral nonlinearities result from errors produced in a conversion between analog and digital values over a wide range of such values. Digital nonlinearities result from errors produced in a conversion between analog and digital values over a relatively narrow range of such values.

The converting apparatus now in use also has a problem of major proportions. This results when particular digital values are increased incrementally by a single digit. For example, problems in the converters now in use result when a binary representation of "511" is converted to a binary representation of "512". This results from the fact that the binary representation of "511" is represented by a value of "0111111111" and a binary representation of "512" is represented by "1000000000" where the least significant digit is at the right. As will be seen, the value of each binary digit changes when the decimal value changes from "511" to "512". As the binary values change from "0111111111" to "1000000000", discontinuities may occur because there is a change between a binary value of "0" and a binary of "1" at each digital position. These discontinuities may present the converter from being truly monotonic. This problem even exists in converters which are made quite complex in an attempt to overcome the problem.

In copending application Ser. No. 383,544 filed by Henry S. Katzenstein for "Apparatus for Converting Data Between Analog and Digital Values" in the United States Patent Office on June 1, 1982, and assigned of record to the assignee of record of this application, apparatus is disclosed and claimed for converting between digital and analog values on a monotonic basis. Such apparatus is simple and inexpensive and reliable. It is able to operate with a high precision at high levels of power. As a result, the converting apparatus of application Ser. No. 383,544 is capable of being used in areas not available for the converters of the prior art. For example, the converter of application Ser. No. 383,544 is able to be used for a wide variety of different applications in the digital audio, digital video and instrumentation fields.

The converter of application Ser. No. 383,544 has other important advantages. It includes a repetitive which decodes the digital signals and also provides a controlled connection of output members to an output line to provide a monotonic conversion of digital signals to an analog value. It also provides the decoding and the connection of the output members to the output line in a single delay time. The number of output members connected to the output line at any instant provides an indication of the analog value represented by the digital signals at that instant.

In the converter of application Ser. No. 383,544, the repetitive array is prefereably defined by a plurality of control switches arranged in subsets each receiving an individual one of the digital signals and each including a number of switches related to the digital value of the associated digital signal. The output members progressively connected to the output line for increasing digital values are not linearly disposed relative to one another.

This invention also provides a converter which has a number of advantages discussed above for the converter of application Ser. No. 383,544. However, the number of switches in the repetitive of this converter are less for a particular number of digital signals (or bits) to be converted than the number of switches in the repetitive array of application Ser. No. 383,544 for the same number of digital signals (or bits) to be converted. Furthermore, the output members progressively connected to the line for increasing digital values preferably have a linear disposition relative to one another. The switches in the repetitive array are preferably disposed in subsets each receiving an individual one of the digital signals and each having a number of switches inversely related to the digital significance of such individual one of the digital signals.

The apparatus of this invention converts to an analog value a plurality an digital signals each having characteristics representing an individual digital value. A plurality of switches are disposed in sub-sets with the switches in each sub-set being responsive to an individual one of the digital signals. The number of switches in each sub-set is related to the digital significance of the sub-set, preferably on an inverse basis.

The switches are connected in a repetitive array to output members and a line to provide for the connection of progressive ones of the output members to the line in accordance with the pattern of the switches in the conductive and nonconductive states in representation of progressive increases in the digital value. The repetitive array also provides, with such progressive increases in the digital values, for the continued connection to the output line of the members previously connected to the line. The repetitive array may be responsive to the digital signals, in a single delay time. The output members progressively connected to the line preferably have a linear disposition. A current flows through each of such output members to indicate the analog value on a cumulative basis.

In the converter, each of the output members may be connected to an individual one of the switches. Alternate ones of the output members may be connected to the control switches in the sub-set of least digital significance; alternate ones of the remaining output members may be connected to the control switches in the sub-set of next remaining digital significance; and the other output members may be connected to the switches in the sub-sets of progressive digital significance in a corresponding pattern.

Figure 1:
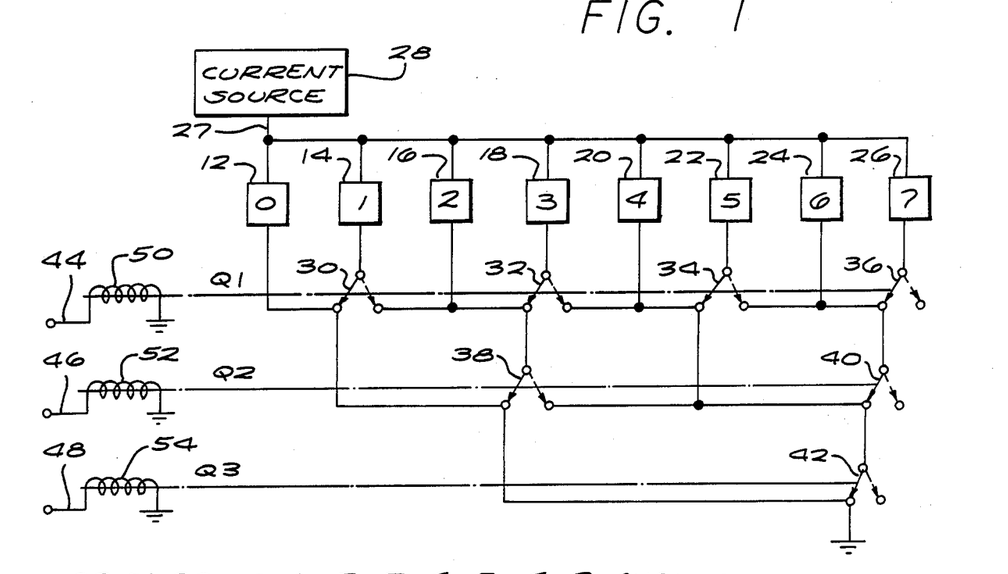
FIG. 1 is a schematic circuit diagram of one embodiment of a converter constituting this invention.

In one embodiment of the invention a converter generally indicated at 10 is illustrated in FIG. 1. The converter includes a plurality of output members 12-26 (even numbers only). Each of the output members 12-26 (even numbers only) may be constructed to provide an output current having the same characteristics as the output provided by the other members. For example, the output members 12-26 (even numbers only) may constitute current sources which provide substantially equal currents when energized. The output members 12-26 may constitute transistors which may have conductive and nonconductive states and which provide a large and substantially constant current when conductive. For example, the members 12-26 may constitute C-MOS transistors. The output members may also constitute capacitors as disclosed and claimed in application Ser. No. 553,041 filed in the United States Patent Office on Nov. 18, 1983, by Henry S. Katzenstein for "Apparatus for Converting Data Between Digital and Analog Values" and assigned of record to the assignee of record of this application. The output members 12-26 are connected through a line 27 to a current source 28.

A plurality of switches 30-42 (even numbers only) are disposed electrically in array having a repetitve pattern of the switch connections to obtain an operation of the switches in a pattern dependent upon the value of a binary coded input word. Each control switch may be considered to be a single-pole, double-throw switch with a movable arm and two stationary contacts. The switches 30, 32, 34 and 36 may be considered to constitute a first subset; the switches 38 and 40 may be considered to constitute a second subset; and the switch 42 may be considered to constitute a third subset.

The switches 30-42 (even numbers only) may be considered to be in a normal state of operation where the movable arm in each of the switches engages the right stationary contact in FIG. 1. The switches 30, 32, 34 and 36 are adapted to be responsive to a binary coded input signal on a line 42 of least digital significance; the switches 38 and 40 are adapted to be responsive to a binary coded input signal on a line 46 of next least digital significance; and the switch 42 is adapted to be responsive to a binary coded input signal on a line 48 of next highest digital significance.

The signals on the lines 44, 46 and 48 preferably represent information in binary form. For example, the signals on the line 44 may represent a binary value of "1" and the signals on the lines 46 and 48 may respectively represent binary values of "2¹" and "2²". Illustratively, a binary "1" may be represented by a signal of high amplitude and a binary "0" may be represented by a signal of low amplitude. Although only three digits are shown in the embodiment of FIG. 1, it will be appreciated that any particular number of digits may be used. This is particularly true since the switches 30-42 (even numbers only) are connected in a recursive arrangement which can be easily expanded in the same format as shown in FIG. 1.

Actuating means such as solenoids are schematically shown in FIG. 1 as being associated with each of the lines 44, 46 and 48. The solenoids respectively associated with the lines 44, 46 and 48 are designated as 50, 52 and 54. As will be appreciated, the solenoids 50, 52 and 54 may be considered to be representative of different types of arrangements which can be used. The switches 30-42 (even numbers only) may be electromagnetic or may constitute any other type of arrangement for providing one state of operation when the digit controlling the operation of the switch has a binary value of "1" and for providing another state of operation when the digit controlling the operation of the switch has a binary value of "0".

As shown in FIG. 1, the movable arms of the switches 30, 32, 34 and 36 are respectively connected to the output members 14, 18, 22 and 26 constituting alternate ones of the output members in the linear disposition. Similarly, the movable arms of the switches 38 and 40 are respectively connected to the output members 16 and 24 constituting alternate ones of the remaining output members in the linear disposition. A connection is made from the movable arm of the switch 42 to the output member 20.

The movable arm of the switches 38 connected to the left stationary contact of the switch 32 and the right stationary contact of the switch 30, and the movable arm of the switch 40 is connected to the left stationary contact of the switch 36 and the right stationary contact of the switch 34. Similarly, the movable arm of the switch 42 is connected to the left stationary contact of the switch 34 and the right stationary contacts of the switches 38 and 40. A common connection is provided between the left stationary contacts of the switches 30, 38 and 42 and this common connection may be connected to a reference line such as ground. No connections are made to the right stationary contacts of the switches 36, 40 and 42.

The control switches are connected in a recursive relationship. This results from the fact that the switches are connected in repetitions of two basic blocks which are quite similar to one another. One basic block is represented by the switches 42, 38 and 40 or by the switches 40, 34 and 36 and the other basic block may be considered to be represented by the switches 38, 30 and 32. If the repetitive array should be expanded beyond the three digits shown in FIG. 1, the successive subsets would be represented by expanded number of switches. These switches would be connected in blocks wherein one block for each subset would correspond to that represented by the switches 40, 34 and 36 and the other blocks for that subset would correspond to that represented by the switches 38, 30 and 32.

As will be seen, the control switches 30-42 (even numbers only) are connected in a repetitive array to one another and to the output members 12-26 (even numbers only) to avoid any crossover of leads connecting the control switches and the output members. This is important in minimizing capacitive effects. Such capacitive effects are undesirable since they would otherwise tend to limit the maximum frequency at which the converter of FIG. 1 can operate.

The output members 12-26 (even numbers only) are disposed in a linear relationship. Thus, the output members 12-26 are progressively energized for increasing digital values. For examples, the output members 12, 14, 16 and 18 are energized to represent a value of "3". These members remain energized for a value of "4" but the output member 20 also becomes energized. The output member 12 is always energized since it represents a value of "0".

The operation of the converter of FIG. 1 may be seen from specific examples. For example, for a value of "3", signals representing a binary value of "1" are introduced to the lines 44 and 46. This causes the switches 30, 32, 34 and 36 and the switches 38 and 40 to be actuated from their right stationary contacts to their left stationary contacts in FIG. 1. When this occurs, the output member 14 becomes energized through the switch 30; the output member 16 becomes energized through the switch 38; and the output member 18 becomes energized through the switches 32 and 38.

For a value of "4", the movable arms of the switches 30, 32, 34 and 36 and the switches 38 and 40 are released to engage the right stationary contacts. However, the movable arm of the switch 42 is energized to engage the left stationary contact. As a result, the output member 14 is energized through the switch 30; the output member 16 is energized through the switches 38 and 42; the output member 18 is energized through the switches 32, 38 and 42; and the output member 20 is energized through the switch 42.

As will be seen, the repetitive array shown in FIG. 1 and described above provides only a single time delay. The term "time delay" may be considered as that time required for a switch to open or close. The single "time delay" results from the fact that all of the switches in the different subsets open or close simultaneously. In this way, the converter is able to convert a digital value to an analog value in a minimal time.

Figure 2:
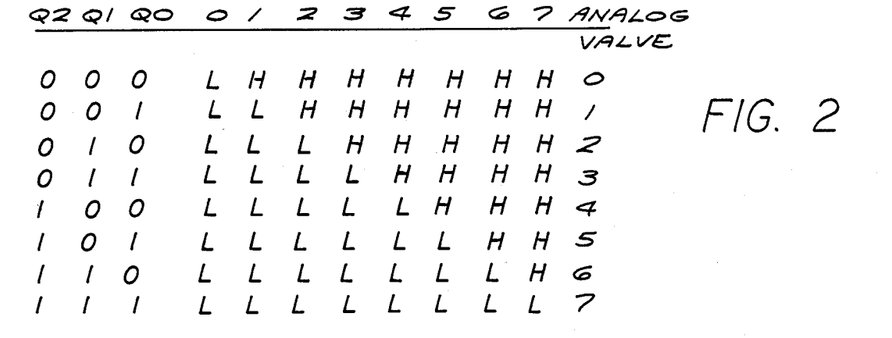
FIG. 2 is a truth table illustrating the operation of the converter shown in FIG. 1.

FIG. 2 illustrates the interrelationship between the values of the signals on the line 44, 46 and 48 and the flow of current through the different output members in FIG. 1. In FIG. 2, a flow of current to an output member is represented by an "L" and an "H" indicates that no current flows through the output member. The indications of "L" and "H" are truly representative because the voltage on the output member approaches the reference potential such as ground when the output member is conductive and the voltage on the output member approaches the voltage from the source 28 when the output member is nonconductive. The reference line such as ground on the left stationary contact of the switch 42 may be considered to provide an output line.

Figure 3:
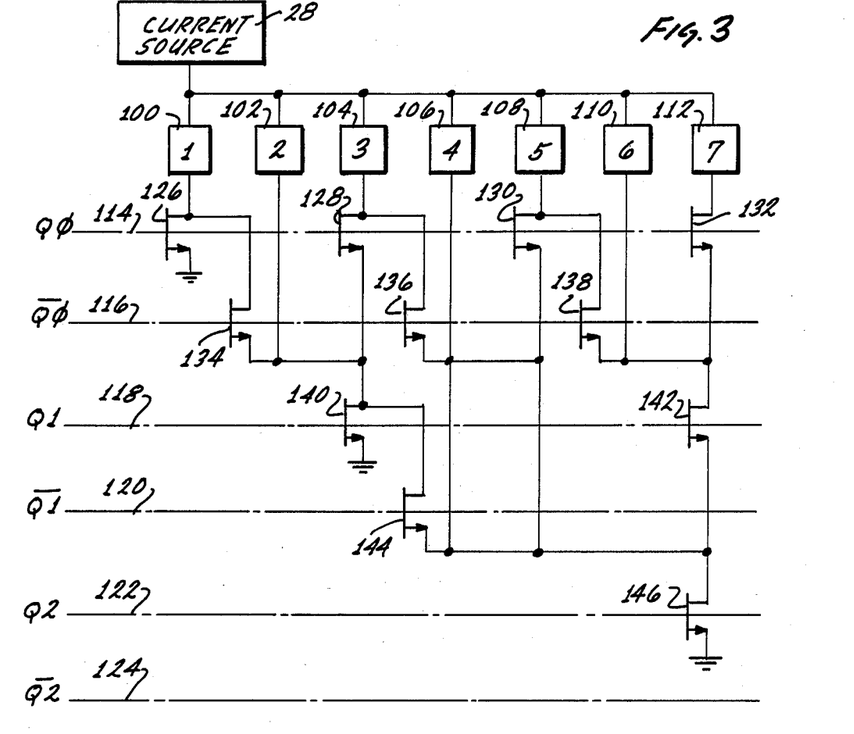
FIG. 3 is a circuit diagram of a converter constituting another embodiment of the invention.

FIG. 3 shows a converter similar to that of FIG. 1 in its principles of operation. However, the converter of FIG. 3 includes transistors as the control switches rather than actual switches as in the embodiment of FIG. 1. The embodiment of FIG. 3 includes output members 100-112 (even numbers only) corresponding to the output members 12-26 in the embodiment of FIG. 1. In the embodiment shown in FIG. 3, pairs of signal lines are provided. A pair of lines 114 and 116 provide signals representing the digital value "$2^0$". Similarly, a pair of lines 118 and 120 provide signals representing a digital value of "$2^1$" and a pair of lines 122 and 124 provide signals representing a digital value of "$2^2$". The line 114 provides a signal of high voltage for a digital value of "1" and the line 116 provides a low voltage for such a digital value. Conversely, the line 116 provides a high voltage for a digital value of "0" and line 114 provides a low voltage for such a digital value. Similar relationships are provided for the lines 118 and 120 and the lines 122 and 124.

A repetitive array is defined in FIG. 3 by a plurality of transistors. These transistors may be considered as being divided into subsets. For example, transistors 126, 128, 130, 132, 134, 136 and 138 may be considered as one subset. Similarly, transistors 140, 142 and 144 may be considered to constitute a second subset and a transistor 146 may be considered to constitute a third subset. In the embodiment shown in FIG. 1, the transistors may constitute field effect transistors or any other suitable types of transistors. When field effect transistors are used, the transistors 126-146 (even numbers only) may constitute N-channel field effect transistors.

The bases of the transistors 126, 128, 130 and 132 are connected to the line 114 and the bases of the transistors 134, 136 and 138 are connected to the line 116. Similarly, connections are made from the line 118 to the basis of the transistors 140 and 142 and from the line 120 to the base of the transistor 144. The transistor 146 may have a common connection with the base of the transistor 146. Although the line 124 is provided, no connections are made to this line in the embodiment of FIG. 3.

The sources of the transistors 126, 140 and 146 are connected to a suitable reference potential such as ground. This reference potential may be considered to constitute an output line. The sources of the transistors 128 and 134 have a common connection with the drain of the transistors 140 and 144. The sources of the transistors 136 and 30 are common to the source of the transistor 144 and to the drain of the transistor 146. Connections are made from the sources of the transistors 132 and 138 to the drain of the transistor 142.

The drains of the transistors 126 and 134 are common with each other and the output member 100. The output member 102 is connected to the drains of the transistors 140 and 144. A connection is made from the output member 104 to the drains of the transistors 128 and 136 and the output members 106 is connected to the source of the transistor 146. The output member 108 is common to the drains of the transistors 130 and 138 and the output member 110 is common to the drain of the transistor 142. A connection is made from the output member 112 to the drain of the transistor 132.

The converter shown in FIG. 3 operates in a manner similar to that discussed above for the converter shown in FIG. 1. For example, for a value of "3", signals are produced on the line 114 to make the transistors 126, 128, 130 and 132 conductive and on the line 118 to make the transistors 140 and 142 conductive. As a result, the output member becomes conductive through a circuit including the transistor 126; the output member 102 becomes conductive through a circuit including the transistor 140; and the output member 104 becomes conductive through a circuit including the transistors 128 and 140.

When the value changes to "4", a signal is produced on the line 116 to make the transistors 134, 136 and 138 conductive, on the line 120 to make transistor 144 conductive and on the line 122 to make the transistor 146 conductive. As a result, the output member 100 remains conductive through a circuit including the transistors 134, 144 and 146; the transistor 102 remains conductive through a circuit including the transistors 144 and 146; and the output member 104 remains conductive through a circuit including the transistors 136 and 146. At the same time, the transistor 106 becomes conductive through a circuit including the transistor 146.

Figure 4:
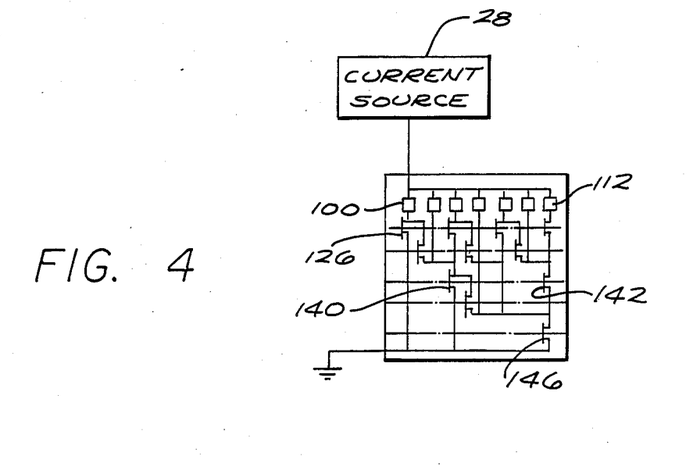
FIG. 4 schematically illustrates a layout of an integrated circuit chip of the converter shown in FIG. 3.

As will be seen, the transistors 100–112 are disposed linearly so that progressive ones of the transistors in the linear arrangement become conductive with increasing digital values and the transistors previously conductive continue to remain conductive for such increasing digital value. The linear disposition of the transistors 100–112 (even numbers only) may be seen from FIG. 4, which illustrates an integrated circuit chip 160 of the converter of FIG. 3 on a schematic basis.

Figure 5:
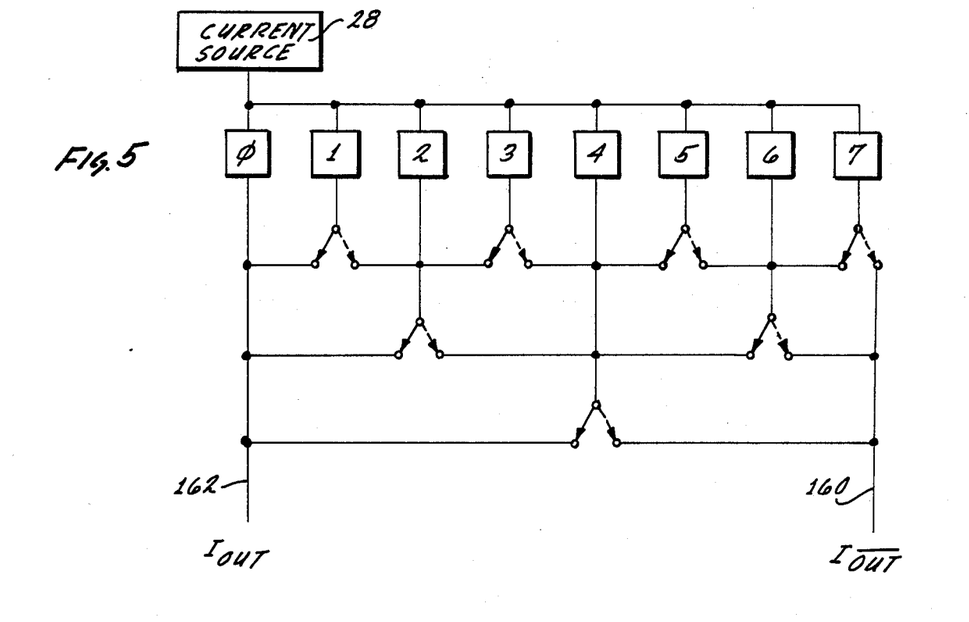
FIG. 5 is a circuit diagram of a converter constituting a further embodiment of the invention.

The embodiment of FIG. 5 is similar to the embodiment of FIG. 1 except that the right stationary contacts of the switches 26, 40 and 42 are connected to an output line 160. This output line receives currents from all of the output members which are not connected to an output line 162. The output line 162 in FIG. 5 replaces to the reference potential on the left stationary contacts of the switches 30, 38 and 42 in FIG. 1.

Figure 6:
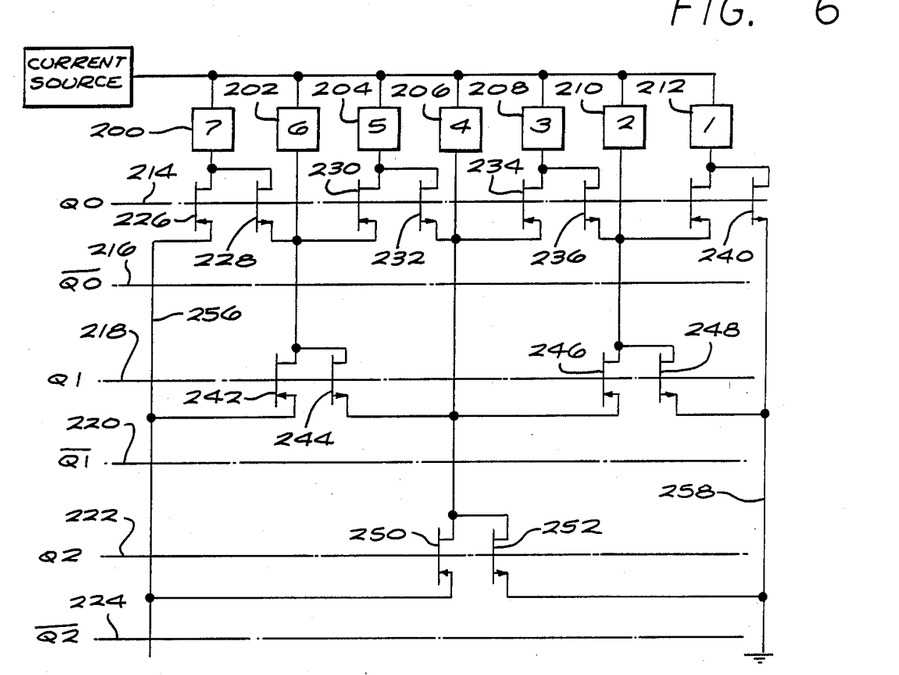
FIG. 6 is a circuit diagram of a converter constituting still another embodiment of the invention.

FIG. 6 illustrates a push-pull implementation of the converter constituting this invention. The embodiment shown in FIG. 6 includes output members 200–212 (even numbers only) corresponding to the output members 100–112 (even numbers only) in FIG. 3. However, in the embodiment shown in FIG. 6, the output members 210, 208, 206, 204, 202 and 200 become progressively conductive to count progressive values between "1" and "7".

The embodiment shown in FIG. 6 also includes lines 214, 216, 218, 220, 222 and 224 corresponding to the lines 114–124 (even numbers only) shown in FIG. 3. The embodiment shown in FIG. 6 further includes a receursive array formed by control transistors 226–252 (even numbers only). The transistors 226, 230, 234, 238, 242, 246 and 250 may constitute p-transistors and the other transistors may constitute n-transistors. All of the transistors may be field effect transistors. The transistors in the matrix arrangement may be associated with output lines 256 and 258.

The signals on the input line 214 are applied to the bases of the transistors 226–240 (even numbers only); the signals on the line 218 are applied to the gates of the transistors 240, 244, 246 and 248; and the signals on the line 224 are applied to the gates of the transistors 252 and 254. As will be seen, no connections are made from the lines 216, 220 and 224 to any of the control transistors in the matrix relationship.

The output line 256 is connected to the sources of the transistors 226, 242 and 250 and the output line 258 is connected to the sources of the transistors 240, 248 and 252. Connections are made from the output member 200 to the drains of the transistors 226 and 228, from the output member 202 to the sources of the transistors 228 and 230 and to the drains of the transistors 242 and 244, from the output member 204 to the drains of the transistors 230 and 232, from the output member 206 to the sources of the transistors 232 and 234, to the sources of the transistors 244 and 246 and to the drains of the transistors 250 and 252, from the output member 208 to the drains of the transistors 234 and 236, from the output member 210 to the sources of the transistors 236 and 238 and to the drains of the transistors 246 and 248 and from the output member 212 to the drains of the transistors 238 and 240. Thus, as will be seen, each of the control transistors is directly connected to at least one of the output members.

The p-transistors such as the transistor 226 become conductive when the signal on the associated input line is low to represent a binary "0". At the same time, the n-transistors such as the transistor 228 are nonconductive. In contrast, the n-transistors become conductive when a high signal representing a binary "1" is introduced to the bases of the transistors. At the same time, the p-transistors are nonconductive.

The operation of the converter shown in FIG. 6 may be seen from several examples. For example, for a value of "3", the signals on the lines 214 and 218 are high and the signal on the line 224 is low. As a result, the output member 212 is connected to the line 258 through the transistor 240 and the output member 210 is connected to the output line 258 through the transistor 248. At the same time, the output member 208 is connected to the output line 258 through the transistors 236 and 248. The other output members are connected to the output line 256. For example, the output member 206 is connected to the output line 256 through the transistor 250.

When a value of "4" is produced, the signals on the lines 214 and 218 are low and the signal on the line 224 is high. This causes the p-transistors in the subset associated with the line 214 to become conductive and the p-transistors in the subset associated with the line 218 to become conductive but the n-transistor 252 associated with the line 224 to become conductive. As a result, the output member 212 remains connected to the output line 258 through the transistors 238, 246 and 252; the output member 210 remains connected to the line 258 through the transistors 246 and 252; and the output member 208 remains connected to the output line 258 through the transistors 234 and 252. The output member 206 becomes connected to the input line 260 through the transistor 252. At the same time, the output members 200, 202 and 204 remain connected to the line 256.

When the embodiment shown in FIG. 6 is made from field effect transistors, a problem may result because, in order for a p-transistor such as the transistor 226 to remain conductive when the signal on the input line such as the line 214 is low, the voltage on the source has to be slightly greater than the voltage on the line. This causes a voltage drop to be produced across the p-transistor such as the transistor 226 so that the voltage on the output line 258 does not approach ground. The problem becomes aggravated when an output member is connected to the line 258 through p-transistors in several different subsets. The aggravation results because the voltage drops across the different p-transistors become stacked or cumulative.

Instead of using field effect transistors as the control transistors in the embodiment shown in FIG. 6, C-Mos transistors may be used. C-Mos transistors are advantageous because they eliminate, or at least minimize, voltage drops across transistors and eliminate, or at least minimize, the stacking of or accumlation voltage drops across the transistors in different subsets. This results in part from the fact that the output line 256 may receive a positive potential such as +5 volts and the output line 258 may have a reference potential such as ground.

Figure 7:
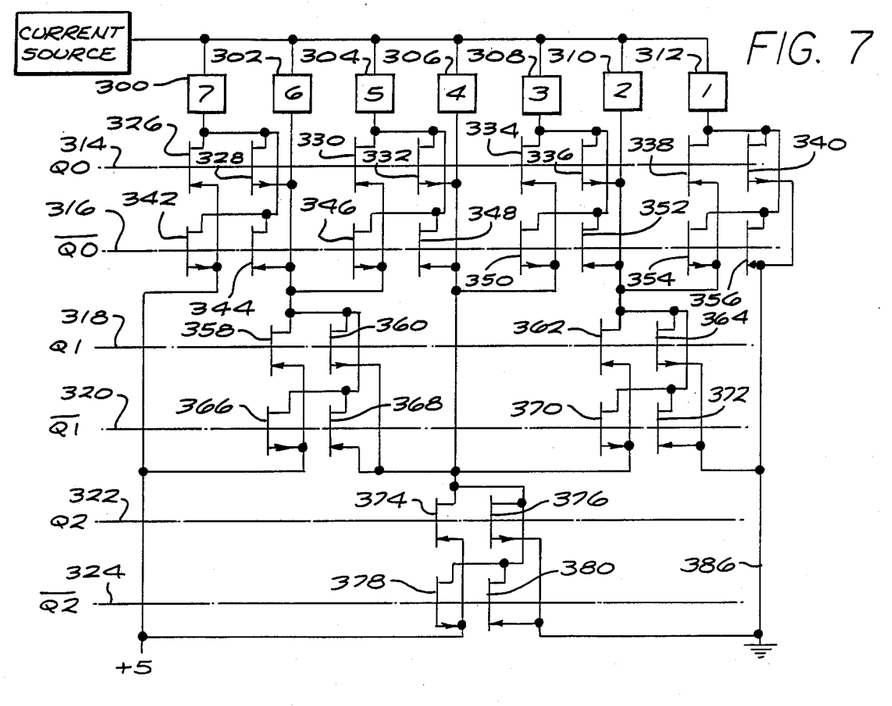
FIG. 7 is a circuit diagram of a converter constituting a still further embodiment of the invention.

The embodiment shown in FIG. 7 includes output members 300-312 (even numbers only) corresponding to the output member 200-212 in FIG. 6. The embodiment shown in FIG. 7 also includes signal lines 314, 316, 318, 320, 322 and 324 respectively corresponding to the signal lines 214-224 (even numbers only) in FIG. 6. The embodiment further includes control transistors 326-380 (even numbers only) in a repetitive array. The transistors 326, 330, 334, 338, 344, 348, 352, 356, 358, 362, 368, 372, 374 and 380 are p-transistors and the others are n-transistors. The transistors may be either field effect transistors or C-Mos transistors. A pair of output lines 384 and 386 are provided. The output line 384 receives a positive potential such as 5 volts and the output line 386 has a reference potential such as ground.

The bases of the transistors 326-340 (even numbers only) receive the signals on the line 314 and the bases of the transistors 342-356 (even numbers only) receive the signals on the line 316. The bases of the transistors 358, 360, 362 and 364 are connected to the line 318 and the bases of the transistors 366, 368, 370 and 372 are connected to the line 320. Connections are made from the signal line 322 to the bases of the transistors 374 and 366 and from the signal line 324 to the bases of the transistors 378 and 380.

The sources of the transistors 326, 342, 358, 366, 374 and 378 are common with the output line 384 and the sources of the transistors 340, 356, 364, 372, 374 and 380 are common with the output line 386. Connections are made from the output member 300 to the drains of the transistors 326, 328, 342 and 344, from the output member 302 to the sources of the transistors 328, 344, 330, 340 and 346 and to the drains of the transistors 358, 360, 366 and 368, from the output member 304 to the drains of the transistors 330, 332, 346 and 348 and from the output member 306 to the sources of the transistors 332, 348, 334 and 350 and to the drains of the transistors 374, 376, 376 and 380. The output member 308 has a common connection with the drains of the transistors 334, 336, 350 and 352 and the output member 310 has a common connection with the sources of the transistors 336, 352, 338 and 354 and with the drains of the transistors 362, 364, 370 and 372. The output member 312 is common with the drains of the transistors 338, 340, 354 and 356.

Progressive ones of the output members from the right end of FIG. 7 become connected to the output line 386 with progressive increases in the digital values. For example, for a value of "3", the output member 312 is connected to the output line 386 through the transistor 340 and also through the transistor 356; the output member 310 is connected to the output line 386 through the transistor 364 and also the transistor 372; and the output member 308 is connected to the line 386 through a circuit including the transistors 336 and 364. The other output members are connected to the line 384.

When the digital value changes from "3" to "4", the output members 312, 310 and 308 remain connected to the output line 386. The circuit for the output member 312 includes the transistor 354 and the transistor 372; the circuit for the output member 310 includes the transistor 372; and the circuit for the output member 308 includes the transistor 350 and the transistor 376. At the same time, the output member 306 becomes connected to the output line 386 through the transistor 376. The other output member remain connected to the output line 384.

The converters shown in FIGS. 1, 3, 5, 6 and 7 and described above have certain important advantages. For example, the converters provide a repetitive array which is constructed to receive directly the digital signals on the input lines such as the lines 214 through 224 (even numbers only) in FIG. 6 and cooperate on such signals to provide, on an output line such as the output line 258 in FIG. 6, a current having an amplitude directly related to the analog value represented by the digital input signals. In this way, the converter has a simple and straightforward construction and is still able to provide an accurate analog indication of a digital value.

By providing an arrangement in which all of the output members such as transistors are conductive and by switching progressive output members to an output line such as the line 258 in FIG. 6 as the digital value progressively increases, the monotonic operation of the converters shown in FIGS. 1, 3, 5, 6 and 7 is assured. Furthermore, when the output members such as transsisitors are made with precision and when a considerable number of transistors are responsive to the operation of the matrix arrangements shown in FIGS. 1, 3, 5, 6 and 7, the converters are operative to provide minimal differential and integral nonlinearities. The monotonic operation of the converter is further assured, particularly in such embodiments as FIGS. 5, 6 and 7, because all of the output members remain continuously conductive, whether they are connected to either one of the output lines such as the lines 256 and 258 in FIG. 6.

Since the output members such as transistors previously connected to the output line, such as the line 258 in FIG. 6, continue to remain connected to this line and additional output members become connected to this line as the digital value progressively increases, no discontinuities are produced as the number being converted changes from a decimal value such as "511" to a decimal value such as "512" or from a decimal value such as "1023" to a decimal value such as "1024". This further assures that the converters of FIGS. 1, 3, 5, 6 and 7 are monotonic.

The converters shown in FIGS. 1, 3, 5, 6 and 7 and described above also have other advantages of some importance. For example, the converters constitute linear decoders since successive ones of the output members linearly disposed on a chip become connected to the output line with progressive increases in the digital value. By connecting successive ones of the linearly disposed output members to the output line with progressive increases in the digital value, only gradual changes can occur in the characteristics of the progressive output members since only gradual changes generally occur across the chip.

The converters of FIGS. 1, 3, 5, 6 and 7 also offer other advantages. For example, the number of transistors included in the repetitive array for any particular number of digital inputs to be converted to the analog value is less than in the previous repetitive array such as disclosed in application Ser. No. 383,544.

Although this application has been disclosed and illustrated with reference to particular applications, the principles involved are susceptible of numerous other applications which will be apparent to persons skilled in the art.

The invention is, therefore, to be limited only as indicated by the scope of the appended claims.

We claim:

1. In combination for providing a conversion between a binary coded input word defined by a plurality of binary bits and an analog value,
    means for providing a plurality of binary coded signals each corresponding to a particular one of the bits in the binary coded input word,
    a plurality of switches each responsive to only a particular one of the binary coded signals, the number of switches responsive to each particular binary coded signal decreasing with increases in the value of the corresponding bit,
    a plurality of output members each operative to pass a current,
    a line,
    means for connecting the switches to one another in an array having a repetitive pattern of the switch connections to obtain an operation of the switches dependent upon the binary coded signals, and
    means for connecting the switches, the output members and the line to provide, for progressive increases in the binary coded input word, corresponding increases in the number of the output members passing current to the line in accordance with the pattern of operation of the switches, such pattern causing a particular sequence for coupling the output members to the line through the switches in response to progressive increases in the binary coded input word, that particular sequence being the passage of current from an additional one of the output members to the line with each increase in the binary coded input word while output members previously passing current to the line continue to pass current to the line.

2. The combination set forth in claim 1 wherein the switches are paired such that, in response to a binary coded signal, one of the switches in each pair is closed and the other is open and wherein the pattern of the closed switches controls the sequence by which the output members pass current to the line.

3. The combination set forth in claim 1 wherein the switches are grouped electrically in sub-sets, each sub-set of switches being responsive only to one bit in the binary coded input word and having a number of switches inversely related to the value of such bit.

4. The combination set forth in claim 1 wherein each of the output members is constructed to pass a particular current and wherein
    the magnitude of the current flowing through the line from the output members at each instant is proportional to the analog representation of the binary coded input word.

5. In combination for providing a conversion between a binary coded input word defined by a plurality of bits and an analog value,
    means for providing a plurality of binary coded signals each corresponding to a particular bit in the binary coded input word,
    the switches in the plurality being grouped in sub-sets, each such sub-set of switches being responsive to only one bit in the binary coded input word,
    a plurality of output members each constructed to pass a current,
    each individual one of the switches in the different sub-sets being respectively connected to a different one of the output members,
    a line,
    means for connecting the switches to one another in an array having a repetitive pattern of the switch connections to obtain an operation of the switches in a pattern dependent upon the binary coded signals, and
    means for connecting the switches, the output members and the line to provide, for progressive increases in the binary coded input word, corresponding increases in the number of the output members passing current to the line in a pattern in accordance with the pattern of operation of the switches, such pattern causing a particular sequence for coupling the output members to the line through the switches in response to progressive increases in the binary coded input word, that particular sequence being the passage of current from an additional one of the output members to the line with each increase in the binary coded input word while the output members previously passing current to the line continue to pass current to the line.

6. The combination set forth in claim 5 wherein the number of the switches in each individual one of the sub-sets is greater for the sub-sets of lower binary value than for the sub-sets of higher binary value.

7. The combination set forth in claim 5 wherein individual ones of the switches are connected to individual ones of the output members.

8. The combination set forth in claim 5 wherein
    the output members, the switches and the signal means are disposed on an integrated circuit chip and wherein
    the output members have progressive physical dispositions on the integrated circuit chip and wherein the output members having the progressive physical dispositions on the integrated circuit chip pass current to the line with progressive increases in the binary coded input word.

9. In combination for providing a conversion between a binary coded input word defined by a plurality of bits and an analog value,
    means for providing first, second and third binary coded signals, the second and third binary coded signals respectively having twice as great a binary value as the first and second binary coded signals, a first sub-set of switches, each of these switches being reponsive only to the first binary coded signal, a second sub-set of the switches, each of these switches being responsive only to the second binary coded signal, a third sub-set of switches, each of these switches being responsive only to the third binary coded signal, the number of switches in the second sub-set being half of the number of switches in the first sub-set and the number of switches in the third sub-set being half of the number of switches in the second sub-set, a plurality of output members each operative to pass a current, means connected to the output members to obtain a flow of current through the output members, first and second lines, means for connecting the switches in the first, second and third sub-sets to one another in an array having a repetitive pattern of the switch connections to obtain an operation of the switches in a pattern dependent upon the binary coded input signals, and means for providing for the passage of current from the output members through the switches to the first and second lines in accordance with the pattern of operation of the control switches, such pattern causing a particular sequence for discontinuing the passage of the current from the output members to the second line and passing current from such output members to the first line in response to prgressive increases in the binary coded input word, that particular sequence being the passage of current from an additional one of the output members to the first line with each increase in the value of the binary coded input word while the output members previously passing current to the first line continue to pass current to the first line.

10. The combination set forth in claim 9, wherein the output members are disposed in a progressive order in a first direction on an integrated circuit chip and the switches, the first and second lines and the signal means are disposed on the integrated circuit chip and wherein alternate ones of the output members are connected to individual ones of the switches in the first sub-set and alternate ones of the other output members are connected to the switches in the second sub-set.

11. The combination set forth in claim 9, wherein individual ones of the switches in each of the first, second and third sub-set are connected to different ones of the output members.

12. The combination set forth in claim 11 wherein the output members, the switches in the first, second and third sub-sets and the first, second and third signal means are disposed on an integrated circuit chip and wherein the output members are disposed in a progressive order in a particular direction on the integrated circuit chip and wherein the repetitive array of the switches provides for the passage to the first line of current from the output members in the progressive order in the particular direction on the integrated circuit chip with progressive increases in the binary coded input word.

13. In combination for providing a conversion between a binary coded input word defined by a plurality of binary bits and an analog value, means for providing a plurality of binary coded signals each corresponding to a particular bit in the binary coded input word, a plurality of switches grouped into sub-sets, each of the sub-sets of switches being responsive only to a particular one of the bits in the binary coded input word, a plurality of output members each operative to pass a current, means connected to the output members to obtain a flow of current through the output members, a line, means for connecting the switches to one another in an array having a repetitive pattern of the switch connections to obtain an operation of the switches in a pattern dependent upon the pattern of the binary coded signals, and means for connecting the switches, the output members and the line to provide, for progressive increases in the binary coded input word, corresponding increases in the number of the output members passing current to the line in accordance with the pattern of operation of the switches, such pattern causing a particular sequence for coupling the output members to the line in response to progressive increases in the binary coded input word, that particular sequence being the passage of current from an additional one of the output members to the line with each increase in the binary coded input word while the output members previously passing current to the line continue to pass current to the line, an integrated circuit chip, the switches, the output members, the signal means and the line being disposed on the integrated circuit chip, the output members being physically disposed on the integrated circuit chip in a paricular direction in a progressive order of their progressive incremental contribution to the analog value, the switches in each sub-set being paired and being provided with a first terminal common to the switches in the pair, alternate ones of the output members being connected to the common terminals of the successive pairs of the switches in the first sub-set and alternate ones of the other output members being connected to the common terminals of the successive pairs of the switches in the second sub-set.

14. The combination set forth in claim 13 wherein there are progressive decreased numbers of the switches in the sub-sets having a progressively increased binary value.

15. The combination set forth in claim 13 wherein there are twice as many switches in each individual sub-set as the switches in the sub-set of next highest binary value.

16. The combination set forth in claim 13 wherein the switches in each individual sub-set are paired and only one of the switches in each pair is closed at any time in response to the binary coded input word.

17. In combination for providing a conversation between a binary coded input word defined by a plurality of bits and an analog value, means for providing a plurality of binary coded signals each corresponding to a bit in the binary coded input word, a plurality of switches grouped electrically in sub-sets, each sub-set of the switches being responsive only to a particular bit in the binary coded input word and having a number of switches inversely related to the value of such bit, a plurality of output members each constructed to provide a current, a line, an integrated circuit chip, the control switches, the output members, the signal means and the line being disposed on the integrated circuit chip, means for providing for the flow of current through the output members, means for connecting the switches in the sub-sets to one another in an array having a repetitive pattern of the switch connections to obtain an operation of the switches in a pattern dependent upon the binary coded input word, and means for connecting the switches, the output members and the line to provide, for progressive increases in the binary coded input word, corresponding increases in the number of the output members passing current to the line in accordance with the pattern operation of the switches, such pattern causing a particular sequence for coupling the output members to the line through the switches in response to progressive increases in the output members passing current to the line in accordance with the pattern of operation of the switches, such pattern causing a particular sequence for coupling the output members to the line through the switches in response to progressive increases in the binary coded input word, that particular sequence being the passage of current from an additional one of the output members to the line with each increase in the binary coded input word while the output members previously passing current to the line continue to pass current to the line, an integrated circuit chip, the output members being physically disposed on the integrated circuit chip in a particular direction in a progressive order of their progressive incremental contribution to the analog value.

18. The combination set forth in claim 17, including, the number of the switches in each individual one of the sub-sets being twice as great as the number of the switches in the sub-set of the next highest binary value.

19. The combination set forth in claim 18, including, individual ones of the output members are connected to individual ones of the switches in the different sub-sets.

20. The combination set forth in claim 19 wherein a second line is provided and the repetitive array operates to switch successive ones of the output members from passing current to the second line to passing current to the first line with progressive increases in the binary coded input word switch successive ones of the output members from passing current to the first line to passing current to the second line with progressive decreases in the binary coded input word.

21. In combination for providing a conversion between a binary coded input word defined by a plurality of bits and an analog value, means for providing a plurality of binary coded signals each corresponding to a particular bit in the binary coded input word, sub-sets of switches, the number of switches in each individual one of the sub-sets being related to the binary value of only one of the bits in the binary coded input word, the number of switches in each sub-set being greater than the number of switches in the sub-set of next highest binary value, a plurality of output members each constructed to pass a current, means for providing for the flow of current through the output members, first and second lines, means for connecting the sub-sets of the control switches to one another in an array having a repetitive pattern of the switch connections to obtain an operation of the switches in a pattern dependent upon the binary coded input word, and means for connecting the switches, the output members and the first and second lines to provide, for progressive increases in the binary coded input word, corresponding increases in the number of the output member passing current to the line in accordance with the pattern of operation of the control switches, such pattern causing a particular sequence for discontinuing the passage of the current from the output members to the second line and passing current from such output members to the first line in response to progressive increases in the binary coded input word, that particular sequence being the passage of current from an additional one of the output members to the first line with each increase in the binary coded input word while the output members previously passing current to the first line continue to pass current to the first line.

22. The combination set forth in claim 21, wherein the output members, and the switch in the sub-set, switches in the sub-sets, the first and second lines and the signal means are disposed on an integrated circuit chip and the output members in the particularly are disposed in a progressive other in a particular direction on the integrated chip and progressive output members in the plurality in the particular direction are continuous electrically with the first line with progressive increases in the analog value.

23. The combination set forth in claim 22, wherein alternate ones of the output members in the progressive order in the particular direction on the integrated circuit chip are connected to the switches in the sub-set of least binary value and alternate ones of the other output members in the progressive order in the particular direction on the integrated circuit chip are connected to the switches in the sub-set of next highest binary value.

24. The combination set forth in claim 23, wherein individual ones of the output members are connected to different ones of the control switches in the different sub-sets.

25. In combination for providing a conversion between a binary coded input word defined by a plurality of binary bits and an analog value, first and second lines, means for providing first and second binary coded signals, the first binary coded signal being related to a first bit of the binary coded input word and the second binary coded signal being related to a second bit of the input word, the first bit having a lower value than the second bit, first and second pairs of switches in a first sub-set, the switches in the first pair having a common terminal and the switches in the second pair having a common terminal, each of the switches in each of the first and second pairs having a terminal in addition to the common terminal, a pair of switches in a second sub-set, the switches in such pair having a common terminal, each of the switches in such pair having a terminal in addition to the common terminal, the switches in the first and second pairs in the sub-set being responsive only to the first signal and the switches in the pair in the second sub-set being responsive only to the second signal, a plurality of output members each constructed to pass a current, the additional terminal of one of the switches in each of the first and second pairs in the first sub-set being connected to the common terminal of the switches in the pair in the second sub-set, the additional terminal of one of the switches in the second pair being connected to the first line, means for connecting the additional terminal of the other switch in the second pair in the first sub-set and the additional terminal of the other switch in the pair in the second sub-set, and means for connecting the common terminals of the switches in each of the first and second pairs in the first sub-set and in the pair in the second sub-set to individual ones of the output members.

26. The combination set forth in claim 25, including, the output members being disposed in a particular order in a particular direction on an integrated circuit chip, the common terminals in the switches in the first pair in the first sub-set being connected to the first output member in the particular direction, the common terminals in the switches in the second pair in the first sub-set being connected to the third output member in the particular direction and the common terminals in the switches in the pair in the second sub-set being connected to the second output member in the particular direction.

27. The combination set forth in claim 25, wherein the common terminals of the switches in each of the first and second pairs in the first sub-set and in the pair in the second sub-set are connected to individual ones of the output members.

28. The combination set forth in claim 27, including, the output members being disposed in a particular order in a particular direction on the integrated circuit chip, the switches being connected to the output members and the line to provide for the passage of current to the line from progressive ones of the output members in the particular order in the particular direction with increases in the binary coded input word.

29. The combination set forth in claim 25, including, the switches having open and closed states, and the switches being connected to the output members and the line to provide for the passage of current through each of the switches in the closed state regardless of the value of the binary coded input word.

* * * * *